(12) United States Patent
Hashimura (10) Patent No.: US 7,902,942 B2
(45) Date of Patent: Mar. 8, 2011

(54) RESONATOR AND FILTER USING THE SAME

(75) Inventor: Akinori Hashimura, Hyogo (JP)

(73) Assignee: Panasonic Corporation, Osaka (JP)

( * ) Notice: Subject to any disclaimer, the term of this patent is extended or adjusted under 35 U.S.C. 154(b) by 412 days.

(21) Appl. No.: 11/994,049

(22) PCT Filed: Sep. 19, 2006

(86) PCT No.: PCT/JP2006/318525
§ 371 (c)(1),
(2), (4) Date: Dec. 27, 2007

(87) PCT Pub. No.: WO2007/037150
PCT Pub. Date: Apr. 5, 2007

(65) Prior Publication Data
US 2010/0109810 A1    May 6, 2010

(30) Foreign Application Priority Data

Sep. 27, 2005  (JP) ................................. 2005-280079

(51) Int. Cl.
*H03H 9/05*   (2006.01)
*H03H 9/46*   (2006.01)
*H03H 9/50*   (2006.01)
(52) U.S. Cl. .......................... 333/186; 333/197; 333/200
(58) Field of Classification Search ................... 333/186, 333/197, 199, 200; 310/323, 330, 331, 333
See application file for complete search history.

(56) References Cited

U.S. PATENT DOCUMENTS

| | | | |
|---|---|---|---|
| 6,707,351 B2 * | 3/2004 | Gorrell | 333/188 |
| 6,710,680 B2 * | 3/2004 | Niu et al. | 333/186 |
| 7,323,952 B2 * | 1/2008 | Pan et al. | 333/186 |
| 7,358,648 B2 * | 4/2008 | Nakamura et al. | 310/333 |
| 7,726,189 B2 * | 6/2010 | Vyas et al. | 73/580 |
| 7,741,932 B2 * | 6/2010 | Nakamura et al. | 333/186 |
| 2007/0046398 A1 * | 3/2007 | Nguyen et al. | 333/186 |

FOREIGN PATENT DOCUMENTS

| | | |
|---|---|---|
| JP | 2002-505046 | 2/2002 |
| JP | 2005-167546 | 6/2005 |

OTHER PUBLICATIONS

Demirci, M.U. Nguyen, C.T.-C, "Higher-mode free-freebeam micromechanical resonators", Frequency Control Cymposium and PDA Exhisition Jointly with the 17th European Frequency and Time Forum, 2003, Proceedings of the 2003 IEEE International, May 8, 2003, pp. 810-813.
Frank D. Bannon et al.; "High Frequency Microelectromechanical IF Filters" Technical Digest, IEEE International Electron Devices Meeting, California, Dec. 8-11, 1996, pp. 773-776.
International Search Report Dated Nov. 28, 2006.

* cited by examiner

*Primary Examiner* — Barbara Summons
(74) *Attorney, Agent, or Firm* — Pearne & Gordon LLP (57) ABSTRACT

A resonator and a filter that can be miniaturized and highly integrated are provided. In the invention, a resonator wherein parts of resonators, support sections, and joint sections are mutually shared is formed. The mutual configuration is selectively switched as required and a large number of frequencies can be selected in the same filter unit. The resonators, the support sections, and the joint sections different in size and shape are used in combination, whereby a filter unit having a large number of selective frequencies is provided.

19 Claims, 8 Drawing Sheets

(a) PRIMARY MODE (b) SECONDARY MODE (c) TERTIARY MODE

RESONATOR AND FILTER USING THE SAME

TECHNICAL FIELD

This invention relates to a resonator and a filter using it and in particular to a resonator formed using an MEMS (Micro Electro Mechanical Systems) technology and a filter.

BACKGROUND ART

At present, a dual mode radio such as a mobile telephone (GSM/UMTS) or a mobile telephone/wireless LAN (GSM/WLAN) is commercially available; attention is focused on miniaturization of an RF filter section as a bottleneck to realize a multiband radio as a future compatible system. For this system, in addition to microminiaturization, high Q, variable filter, etc., becomes a key, but it is difficult to realize them under present circumstances. Then, in recent years, in integration, application of a filter using a minute electromechanical resonator as a multiband radio filter has been expected from the viewpoint of an affinity for an IC, etc.

Figure 11:
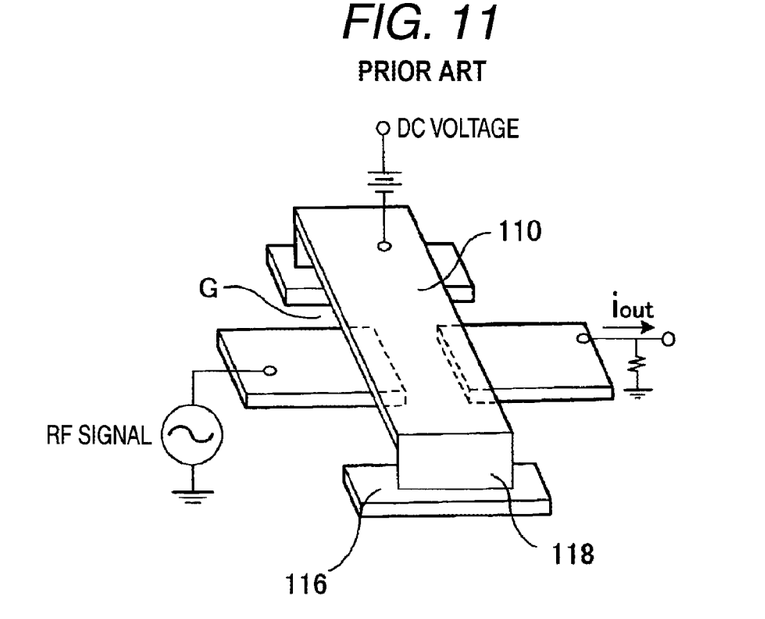
FIG. 11 is a perspective view to show an electromechanical resonator in a related art example.

As FIG. 11 shows an example, an electromechanical resonator in a related art is mainly made up of an oscillator 110 for selecting a resonance frequency, a support section 118 for supporting the oscillator 110 from a base, and an electrode for exciting and detecting the oscillator 110. A configuration of an electromechanical filter having a large number of electromechanical resonators arranged and mechanically joined in a joint section is also proposed (non-patent document 1).

Figure 12:
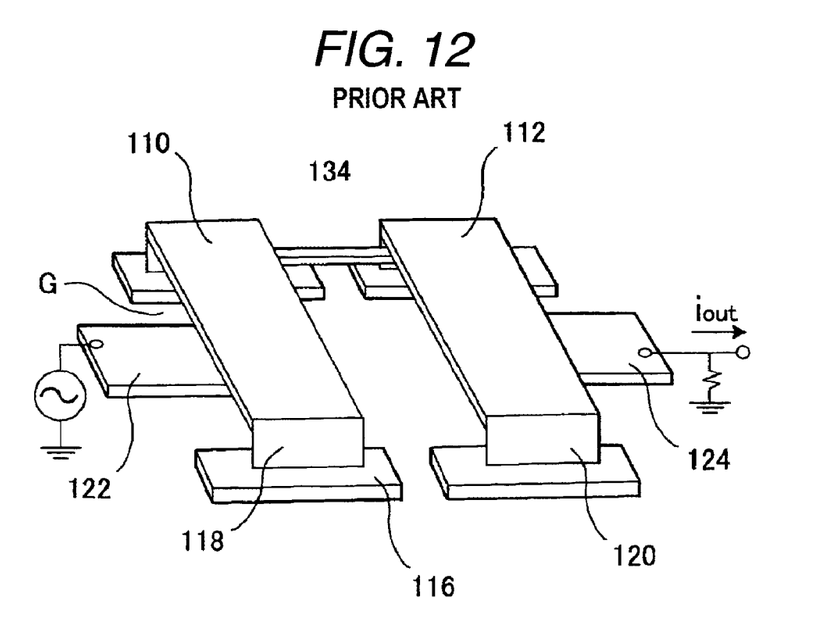
FIG. 12 is a perspective view to show an electromechanical filter provided by mechanically joining two electromechanical resonators in the related art example.

FIG. 12 shows an example of the electromechanical filter. In this case, as the structure of the electromechanical filter, one joint section 134 exists for support sections 118 and 120 where at least two oscillators 110 and 112 are supported from bases 116. Further, to form a multistage filter, the number of the oscillators and the number of the joint sections are increased as required.

The electromechanical filter uses the following principle: First, when an RF signal is input to an excitation electrode 122, an electrostatic force occurs between gaps G of the oscillator 110 and the excitation electrode 122. At this time, the oscillator 110 and the oscillator 112 connected to the oscillator 110 via the joint section 134 largely oscillate only if the self resonant frequency of the oscillator and the frequency of the input RF signal. If the oscillator 112 oscillates, the capacity between the oscillator 112 and a detection electrode 124 changes and thus if a potential (DC voltage) is applied, an electric current is output from the detection electrode 124. Thus, the RF signal is output only when the self resonant frequency of the oscillator and the frequency of the RF signal, so that the device can be used as a frequency selective device, namely, a filter.

Non-patent document 1: Bannon, Clark, Nguyen "High Frequency Micromechanical IF Filters" Technical Digest, IEEE International Electron Device Meeting, San Francisco, Calif. 1996 pp. 773-776.

DISCLOSURE OF THE INVENTION

Problems to be Solved by the Invention

However, in the electromechanical resonator or the electromechanical filter in the related art, the role varies from one portion of the structure to another; for example, each portion of the oscillator having the self resonant frequency, the joint section for joining two or more oscillators, the support section for supporting the oscillator on the base, etc., plays only one role. Accordingly, miniaturization of the filter is limited and even if a single resonator is miniaturized, if a large number of resonators are arranged, the whole occupation area enlarges; this is a problem.

Degradation of the electric characteristic of a frequency-dependent electromechanical filter (Q value) is a large problem for putting into practical use; miniaturization and high Q value of the filter are indispensable for a multiband radio, etc., as a future compatible system including dual mode radios such as a mobile telephone and a wireless LAN commercially available at present.

It is therefore an object of the invention to provide a small-size resonator that can be highly integrated. It is also an object of the invention to provide a small-size filter having a high Q value.

Means for Solving the Problems

To solve the above-described problems, the invention is a resonator including a first resonator having a first excitation electrode and a first oscillator for mechanically oscillating by the first excitation electrode; and a second resonator having a second excitation electrode and a second oscillator for mechanically oscillating by the second excitation electrode, wherein a support section for supporting the first oscillator forms the second oscillator.

According to the configuration, the oscillator and the support section play two roles as one, so that miniaturization and high integration are made possible. If the first and second oscillators are made each a mutual support section of the other, each plays one or more roles, so that further miniaturization and high integration are made possible.

The invention contains the above-described resonator wherein a node of oscillation of the first oscillator is positioned at a connection part of the first oscillator and the second oscillator.

According to the configuration, the node of oscillation of the first oscillator is positioned at the connection part of the first oscillator and the second oscillator, so that even at the resonance oscillation time of the first oscillator, the node of the first oscillator ideally is in a fixed state and thus the second oscillator can be prevented from being oscillated and oscillation energy dissipation to the support base can be decreased for improving the Q value.

The invention contains the above-described resonator wherein the first oscillator has a resonance frequency lower than the second oscillator.

According to the configuration, the node at the oscillation time of the first oscillator having a larger wavelength forms the connection part with the second oscillator, so that it is made possible to decrease the effect on the second oscillator which is smaller and is easily affected because of an external factor.

The invention contains the above-described resonator wherein when one of the first and second oscillators oscillates, the other is placed in a pull-in state.

According to the configuration, each plays one or more roles, so that further miniaturization and high integration are made possible and in addition, the resonator is configured so that when one oscillates, the other is placed in the pull-in state, so that oscillation of the other can be prevented from affecting oscillation of the oscillator.

The invention contains the above-described resonator wherein an insulating layer is provided at least in a part of a face of the first oscillator coming in contact with the first excitation electrode so that the first excitation electrode and the first oscillator abut via the insulating layer when a pull-in state is entered.

According to the configuration, the pull-in state is entered in an electrically insulated state and the first oscillator is fixed to the first excitation electrode and acts as the support section of the second oscillator, so that a similar state to that in which the second oscillator is fixed using an additional support section can be obtained.

The invention contains the above-described resonator wherein a node of oscillation of the second oscillator is positioned at a connection part of the second oscillator and the first oscillator.

According to the configuration, the node of oscillation of the second oscillator is positioned at the connection part of the first oscillator and the second oscillator and thus even at the resonance oscillation time of the second oscillator, the first oscillator becomes a state close to an ideal fixed electrode, so that oscillation of the second oscillator can be prevented from being affected.

The invention contains the above-described resonator wherein the oscillation of the second oscillator is torsional oscillation.

In the configuration, the second oscillator has the node of oscillation at both ends and thus oscillation of the first oscillator is prevented, whereby the first oscillator becomes a state close to an ideal fixed electrode and the second oscillator is formed as a twinlever and in addition, oscillation energy dissipation to the support base can be decreased at the same time.

The invention contains the above-described resonator further having a third resonator having a third excitation electrode and a third oscillator for mechanically oscillating by the third excitation electrode, wherein at an opposite end of the second oscillator, a support section for supporting the first oscillator forms the third oscillator.

The invention contains the above-described resonator further having a detection electrode for detecting oscillation of at least one of the first to third oscillators.

The invention contains the above-described resonator wherein the first to third resonators have first to third detection electrodes for detecting oscillation of the first to third oscillators respectively.

A filter of the invention is a filter including a first excitation electrode and a pair of first oscillators joined so as to mechanically oscillate by the first excitation electrode; and a second excitation electrode and a pair of second oscillators joined so as to mechanically oscillate by the second excitation electrode, wherein a support section for supporting the first oscillator forms the second oscillator.

In the filter, as in the above-described resonator, the oscillator and the support section play two roles as one, so that miniaturization and high integration are made possible. If the first and second oscillators are made each a mutual support section of the other, each plays one or more roles, so that further miniaturization and high integration are made possible.

The invention contains the above-described filter wherein a node of oscillation of the first oscillator is positioned at a connection part of the first oscillator and the second oscillator.

The invention contains the above-described filter wherein the first oscillator has a resonance frequency lower than the second oscillator.

The invention contains the above-described filter wherein when one of the first and second oscillators oscillates, the other is placed in a pull-in state.

The invention contains the above-described filter wherein an insulating layer is provided at least in a part of a face of the first oscillator coming in contact with the first excitation electrode so that the first excitation electrode and the first oscillator abut via the insulating layer when a pull-in state is entered.

The invention contains the above-described filter wherein a node of oscillation of the second oscillator is positioned at a connection part of the second oscillator and the first oscillator.

The invention contains the above-described filter wherein the oscillation of the second oscillator is torsional oscillation.

The invention contains the above-described filter further having a third filter having a third excitation electrode and a third oscillator for mechanically oscillating by the third excitation electrode, wherein at an opposite end of the second oscillator, a support section for supporting the first oscillator forms the third oscillator.

The invention contains the above-described filter wherein at least one pair of oscillators of the first to third oscillators is joined through a joint section, and wherein the joint section forms the oscillator.

According to the configuration, the joint section acts intact as the oscillator, so that the structure becomes a wasteless structure and becomes a small-size and highly reliable structure.

The invention contains the above-described filter wherein at least one of the first to third filters has a detection electrode being disposed with a predetermined spacing from at least one of the first to third oscillators for detecting oscillation of the oscillator.

The invention contains the above-described filter wherein first to third filters have first to third detection electrodes for detecting oscillation of the first to third oscillators respectively.

Preferably, the oscillators have a triangular section beam structure and a trapezoidal section structure.

According to the configuration, if the trapezoidal section structure serves as the oscillator, the support section for supporting the oscillator from the base is of a triangular section structure and thus the oscillation energy dissipated from the support section can be decreased for providing a high Q value.

The filter of the invention is formed according to the two methods of a mechanical joint method of joining the resonators by the joint section and an electric joint method of using no joint section.

According to the configuration, the joint section and the support section of the filter are also used as resonators, so that a signal flows into the selectively required excitation, detection electrode and it is made possible to implement a filter having a plurality of frequency bands and miniaturization and high integration are also made possible.

Advantages of the Invention

According to the resonator and the electromechanical filter of the invention, each of the oscillator, the support section, and the joint section introducing the problems in the related arts plays one or more roles, so that miniaturization of the electromechanical filter suited to dual mode and multiband systems capable of selecting a plurality of frequencies can be realized. As the resonator of the electromechanical filter having one frequency selection, the minute triangular section beam as compared with the support section of the electromechanical filter is used, so that it is made possible to decrease dissipation of the oscillation energy from the support section for providing a higher Q value.

DESCRIPTION OF REFERENCE NUMERALS

10 Beam (oscillator of trapezoidal section beam type)
16a, b Beam of triangular section beam type (support section, oscillator)
20, 21 Fixed electrode
22, 26, 30 Excitation electrode
24, 28, 32 Detection electrode
40, 42 Beam of trapezoidal section beam type (support section, oscillator)
44 Beam of triangular section beam type (support section, joint section, oscillator)
46, 50, 56 Excitation electrode
48, 52 Detection electrode
60 Fixed electrode
70 Silicon layer
72 BOX layer
74 Silicon (SOI) layer
76 Insulating film
78 (111) crystal plane
80 Sacrifice layer
82 Electrode material
84 Vertex
G1, G2, G3 Gap

BEST MODE FOR CARRYING OUT THE INVENTION

Embodiments of the invention will be discussed in detail with the accompanying drawings.

First Embodiment

Figure 1:
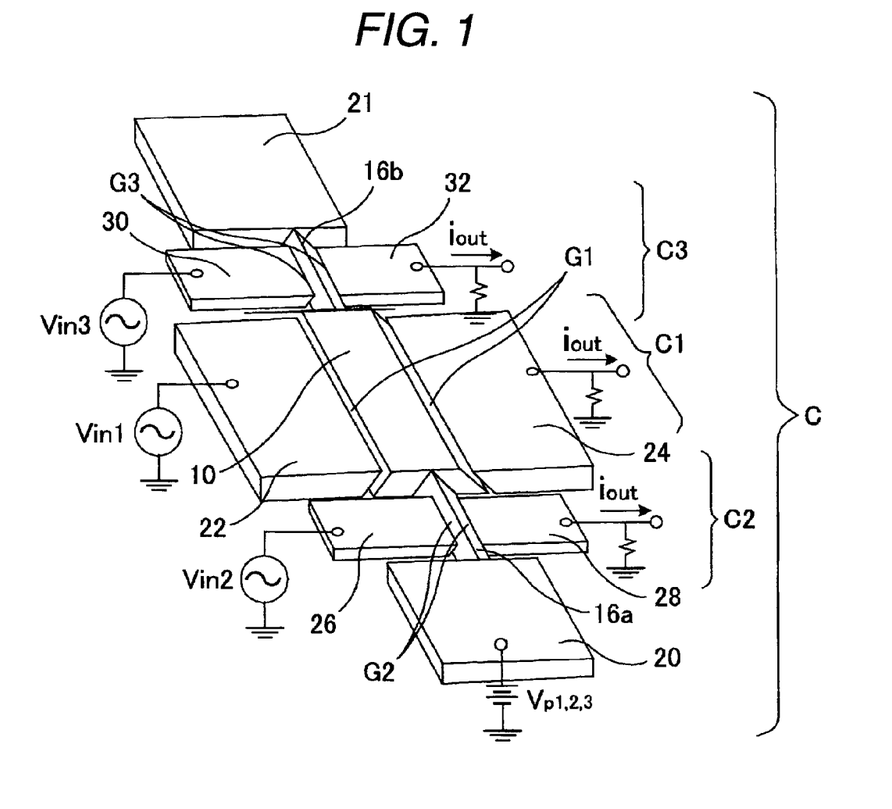
FIG. 1 is a perspective view of an electromechanical resonator to show a first embodiment of the invention.

An electromechanical resonator in a first embodiment of the invention is made up of three resonators of first to third resonators C1 to C3 and the three resonators have inputs Vin1 to Vin3 and outputs Vout1 to Vout3, as shown in a perspective view of FIG. 1. In this configuration, support sections (16a and 16b) for supporting an oscillator (10) of the first resonator C1 from both ends become oscillators of the second and third resonators C2 and C3, and miniaturization of the electromechanical resonator suited to dual mode and multiband systems capable of selecting a plurality of frequencies is realized. That is, the oscillator of the first resonator C1 is made up of a trapezoidal section beam 10, triangular section beams 16a and 16b as support sections, an excitation electrode 22, a detection electrode 24, and gap G1. The oscillator of the second resonator C2 is made up of the triangular section beam 16a, a fixed electrode 20 and the trapezoidal section beam 10 as support sections, an excitation electrode 26, a detection electrode 28, and gap G2. Last, the oscillator of the third resonator C3 is made up of the triangular section beam 16b, a fixed electrode 21 and the trapezoidal section beam 10 as support sections, an excitation electrode 30, a detection electrode 32, and gap G3.

Figure 2A:
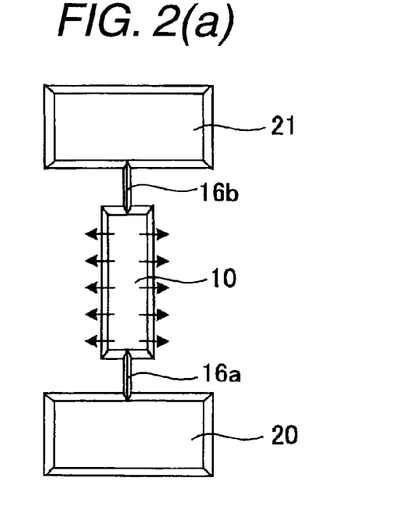
FIG. 2 is an operation drawing of the electromechanical resonator of the first embodiment of the invention.
Figure 2B:
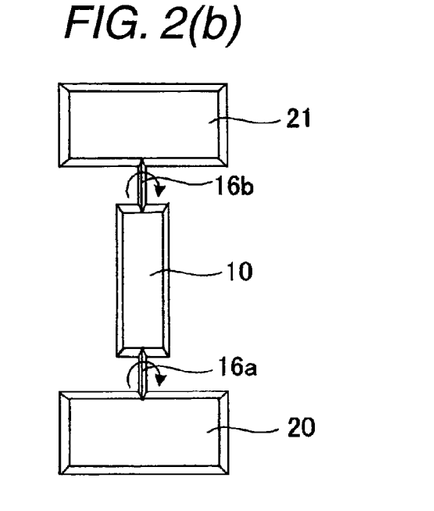

The excitation electrodes are placed so that the first oscillator C1 operates as bulk oscillation of the trapezoidal section beam and the second and third oscillators C2 and C3 operate as torsional oscillation with triangular section beams as oscillators. The oscillators are joined so that mutual nodes become joint sections. It is desirable that at least the joint section with the support section should come in the node of the first resonator. FIG. 2 (a) represents the bulk oscillation mode of the first resonator C1, and the node of oscillation exists in the center of the structure. FIG. 2 (b) represents the case where the oscillator of each of the second resonator C2 and the third resonator C3 resonates in the torsional oscillation mode, and the node of oscillation appears at both ends of the structure.

Next, the operation of the resonator C is as follows:

First, to operate the first resonator C1, voltage Vp1 is applied to the fixed electrode 20 and voltage is added to the beam 10 forming the oscillator and on the other hand, AC voltage vin1 is applied to the excitation electrode 22. Accordingly, an electrostatic force acts on the oscillator (trapezoidal section beam 10) opposed to the excitation electrode 22 with the gap G1 between, and the trapezoidal section beam 10 forming the oscillator is excited in a specific oscillation mode. On the other hand, capacity change occurs in the detection electrode 24 via the gap G1, and current iout1 generated because of the capacity change is output to the detection electrode 24. Likewise, DC bias voltage Vp2 and DC bias voltage Vp3 are applied through the excitation electrode 22 and the excitation electrode 30 to the second resonator C2 and the third resonator C3 for resonating the triangular section beams 16a and 16b, thereby operating the second and third resonators C2 and C3, and the detection electrodes 28 and 32 are caused to output capacity change caused by fluctuations of the gaps G2 and G3 as outputs currents iout2 and iout3.

Since each resonator operates at the natural frequency of the oscillator, usually if one input signal is input to the excitation electrodes of the three resonators at the same time, only the resonator where the frequency of the input signal and the natural frequency of the oscillator match operates, so that the resonator having the selection effect of three frequencies is configured in the first embodiment.

The first embodiment of the invention makes it possible to configure the resonator having the resonance frequencies of the first to third beams, namely, the resonator having a plurality of resonance frequencies and makes it possible to provide the small-size and high Q value resonator.

Figure 3A:
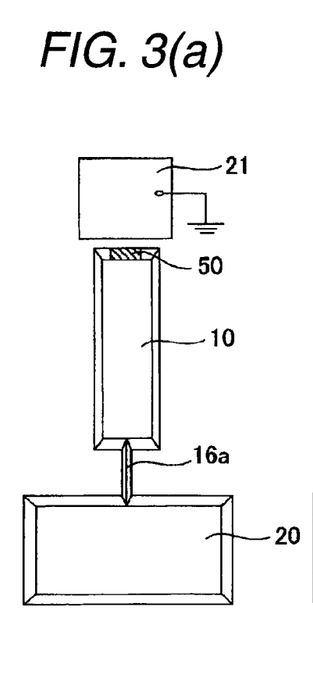
FIG. 3 is a drawing to show a modified example of the electromechanical resonator of the first embodiment of the invention.
Figure 3B:
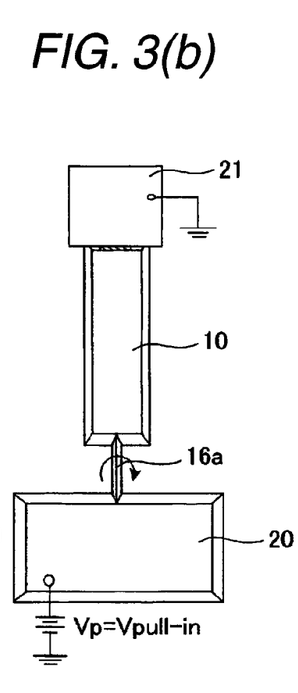
Figure 3C:
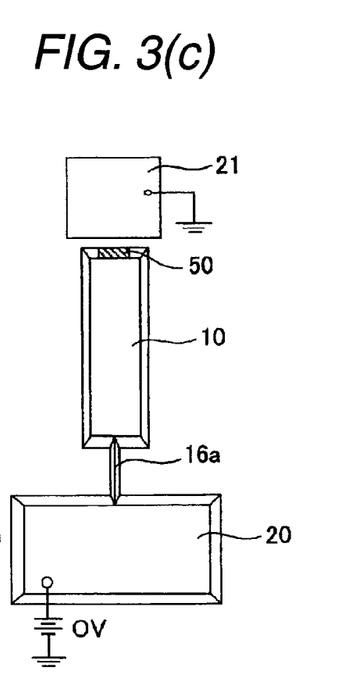

FIG. 3 is a drawing to show a modified example of the first embodiment of the invention; it shows a configuration wherein the first resonator is a cantilever in the first embodiment. The figure shows only the main part centering on the first oscillator and the second oscillator. To excite the second resonator (triangular section beam) in FIG. 3 (*a*), it is ideal to attract the cantilever trapezoidal section beam as a support section to the fixed electrode 21 and fix the beam to prevent unnecessary oscillation of the cantilever trapezoidal section beam. Then, the invention is characterized by the fact that a fixed electrode for attracting the trapezoidal section beam is provided for fixing the support section. A pull-in state thereof is shown in FIG. 3 (*b*). An insulating layer 50 is disposed in one place of a side of the beam, whereby the first oscillator 10 is fixed to the fixed electrode 21 while voltage is applied, and is restored to a still state as shown in FIG. 3 (*c*) when the voltage is shut off. In this case, the pull-in voltage is set like control voltage Vp of the second resonator C2, so that one voltage source can be used to provide both the advantages of driving the resonator and fixing the support section at the same time. The insulating layer is made up of a silicon oxide film, etc., and can be easily formed in an MEMS process. In the example, the fixed electrode and the first oscillator face each other via the insulating layer and are placed in the fixed state while the pull-in voltage is applied, but the excitation electrode and the oscillator may be abutted against each other via the insulating layer in a similar manner.

Figure 4A:
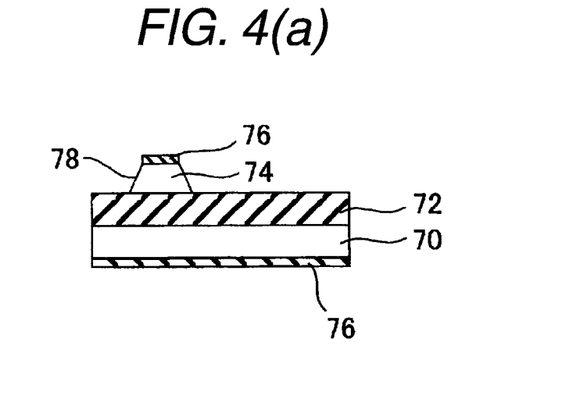
FIG. 4 is a drawing to show a manufacturing process of the electromechanical resonator of the first embodiment of the invention.
Figure 4B:
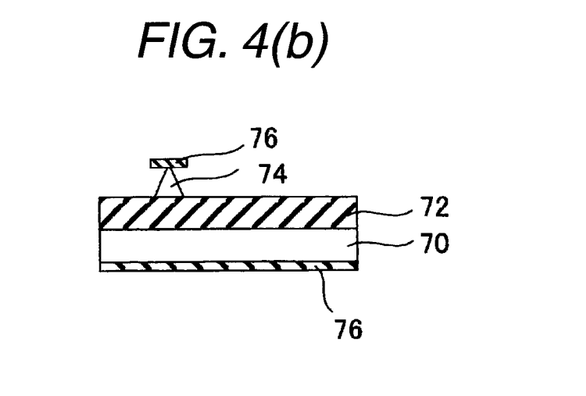
Figure 4C:
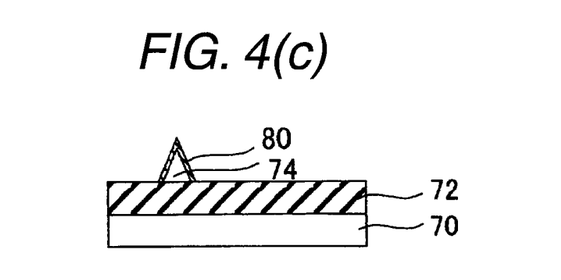
Figure 4D:
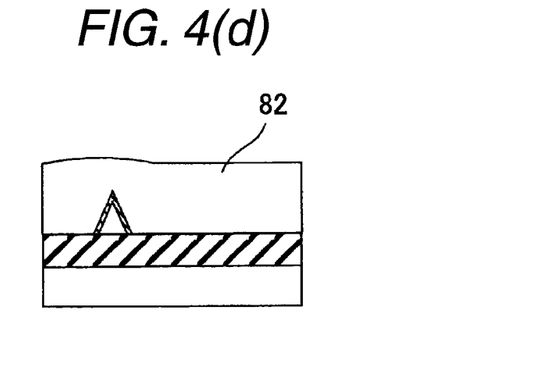
Figure 4E:
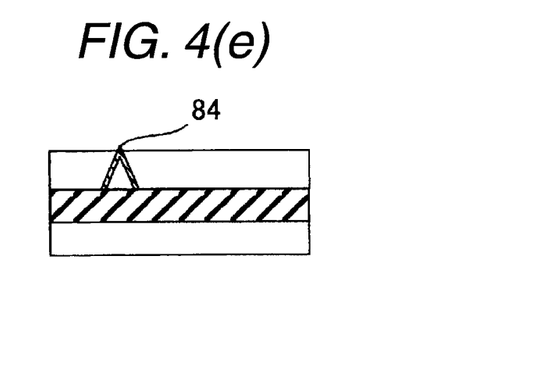
Figure 4F:
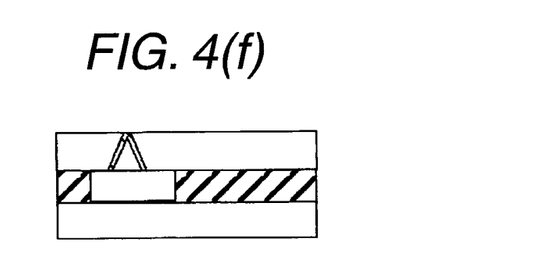

Next, a manufacturing process of the resonator unit of the first embodiment of the invention will be discussed. FIGS. 4 (*a*) to 4 (*f*) show the manufacturing process. The manufacturing method makes it possible to manufacture the structures of the trapezoidal section beam and the triangular section beam shown in the first embodiment in the same process flow.

In the manufacturing method of the invention, an SOI (silicon-on-insulator) substrate having a silicon layer 74 put on a silicon substrate 70 via a silicon oxide film 72 as shown in FIG. 4 (*a*) is used; the silicon layer 74 determines the thickness of the resonator and the silicon oxide film 72 as a BOX (buried oxide) layer plays roles of a sacrifice layer and an insulator in the first embodiment and therefore the thickness of the substrate and the thickness of each layer need to be determined in response to the filter design.

A silicon nitride film 76 is formed on both faces of the SOI substrate according to a CVD method. This silicon nitride film serves as a mask when the monocrystalline silicon layer 74 is wet-etched and after film formation, the silicon nitride film 76 on the surface side is patterned by photolithography and is formed.

As shown in FIG. 4 (*a*), the silicon layer 74 is wet-etched under an etching condition having anisotropy and beam-like patterns 10, 16*a*, and 16*b* are formed. In this case, an aqueous solution prepared so as to have anisotropy is used, whereby the shape is formed in response to the crystal of monocrystalline silicon as a crystal plane at the lowest etching rate. Since silicon differs in the etching rate depending on the crystal orientation, if an etch stop layer as the BOX layer shown in FIG. 4 (*a*) is provided, a trapezoidal section having (111) crystal plane where the etching rate is the minimum as a plane is formed.

Then, if crystal anisotropic etching is further advanced still after the trapezoidal section beam is formed, a shape with the trapezoidal section having (111) left is formed and a triangular section shown in FIG. 4 (*b*) appears. The manufacturing method makes it possible to form the trapezoidal section beam 10 and the triangular section beams 16*a* and 16*b* in FIG. 3 simply by using the same photomask and changing the pattern width only.

Next, after the beams are formed, the insulating film 76 is removed and a sacrifice layer 80 is deposited on the surfaces of the formed beams as shown in FIG. 4 (*c*). The sacrifice layer plays a role of forming the gap G1 shown in FIG. 1 finally.

Further, as shown in FIG. 4 (*d*), an electrode material 82 of a polycrystalline silicon layer, etc., is deposited and the deposited electrode material 82 is etched back, vertexes 84 of the triangular section beams and the trapezoidal section beam are exposed, and the formed electrodes 26, 28, 30, and 32 are patterned (FIG. 4 (*e*)).

Last FIG. 4 (*f*) is a step of releasing the resonator structure from the substrate and at the same time, the sacrifice layer is also etched and gap is formed.

It is thus made possible to provide the electromechanical resonator with high dimensional accuracy.

Second Embodiment

Next, an electromechanical filter will be discussed as a second embodiment of the invention. Two resonators described above in the first embodiment are joined by a joint section 44*e* to form an electromechanical filter. That is, a filter F of the embodiment is a filter including a first excitation electrode, a pair of first oscillators joined so as to mechanically oscillate by the first excitation electrode, a second excitation electrode, a pair of second oscillators joined so as to mechanically oscillate by the second excitation electrode, a third excitation electrode, and a pair of third oscillators joined so as to mechanically oscillate by the third excitation electrode, and a support section for supporting the first oscillators forms the second oscillator and the third oscillator.

Figure 5:
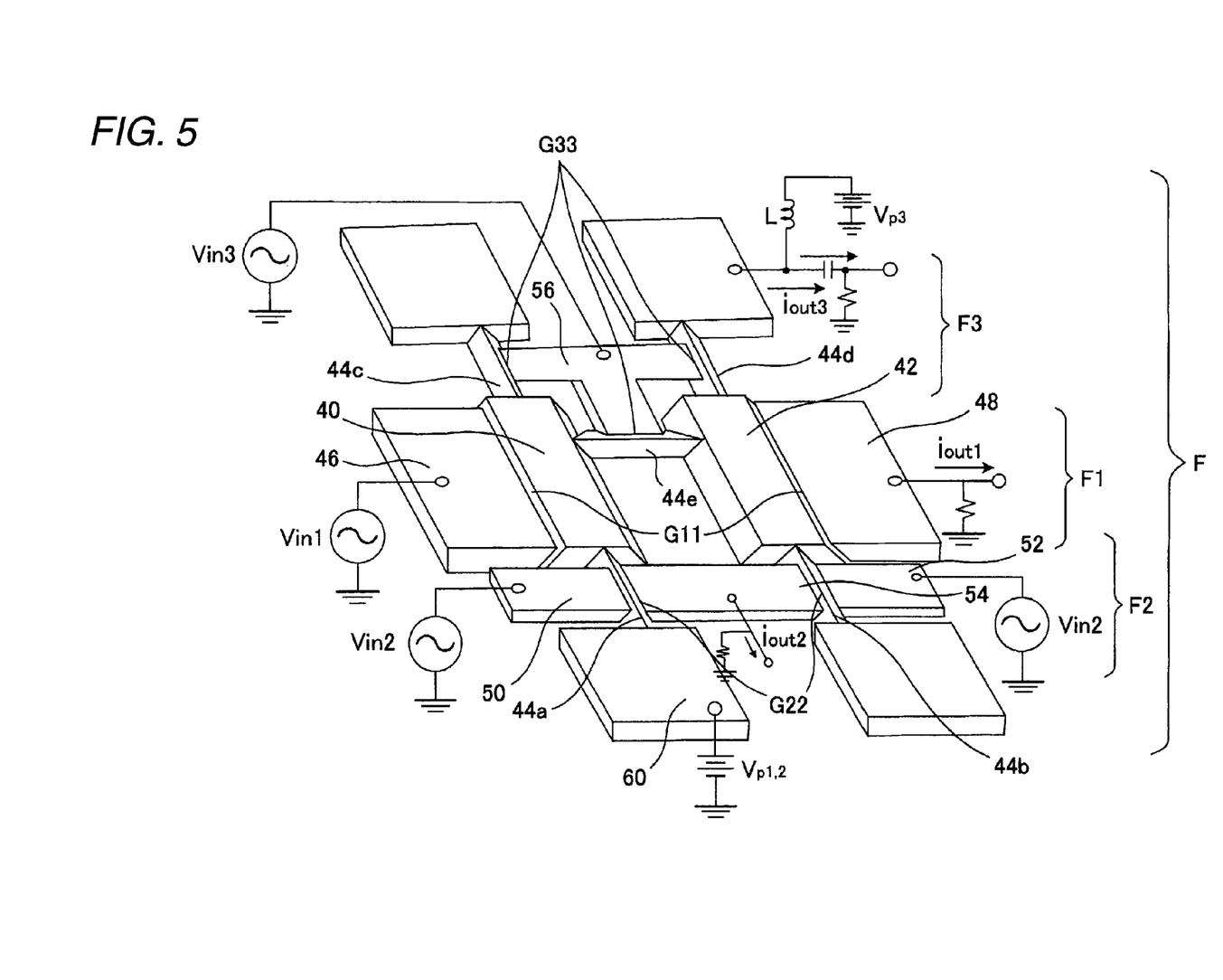
FIG. 5 is a perspective view of an electromechanical filter in a second embodiment of the invention.

FIG. 5 is a perspective view of the electromechanical filter in the second embodiment of the invention. In FIG. 5, the filter is made up of three filters of first to third filters F1 to F3, which have inputs Vin1 to Vin3 and outputs iout1 to iout3. First, the first filter F1 has a structure made up of beams 40 and 42 as the first oscillators, support sections 44*a* to 44*d*, a joint section 44*e*, a first excitation electrode 46, a first detection electrode 48, and four fixed electrodes 60 and containing gap G11. In this structure, to operate the beams 40 and 42 as the first oscillators, DC bias voltage Vp1 is applied to the fixed electrodes 60 and voltage is added to the beams 40 and 42 forming the first oscillators and on the other hand, an AC input signal Vin1 is applied to the first excitation electrode 46. Accordingly, an electrostatic force acts on the gap G11, and the beam 40 forming the first oscillator is excited in parallel with the base in a bulk oscillation mode like that of the resonator of the first embodiment. At the time, oscillation of the beam 40 propagates to the joint section 44*e*, which then is excited in a longitudinal oscillation mode in the same period and consequently the beam 42 forming the other first oscillator is also excited. The first detection electrode 48 is provided via the gap G11 for the beam 42 and the current iout1 having a frequency characteristic based on capacity change is output. The first filter F1 is an example of mechanically joining the two resonators using the joint section 44*e* to form a filter, and each of the second and third filters F2 and F3 described below shows a configuration example of a filter provided by electrically joining two resonators.

The invention is characterized by the fact that the beams 44*a* and 44*b* forming two support sections each having a minute cross-sectional area and length as compared with the beams 40 and 42 forming the first oscillators of the first filter F1 are used as oscillators of the second filter F2. In the second filter F2, a second excitation electrode 50 and a second detection electrode 52 are provided via gap G22 outside the beams 44*a* and 44*b* forming two oscillators (second oscillators), and an AC input signal Vin2 is applied to the excitation electrode 50, 52. In the second filter F2, unlike the first filter F1, the beam 44*e* forming the joint section is not provided and a detection electrode 54 is placed along sides opposed to the oscillators 44a and 44b. Accordingly, while the resonators are mechanically joined along the beam 44e forming the joint section in the first embodiment, the beams 44a and 44b forming the oscillators are electrically joined by the electrostatic force through the (detection) electrode 54 as the joint beam to form a filter in the second embodiment. It is desirable that torsional oscillation by which both ends of the beam 44a, 44b strike a node should be used as the oscillation mode.

Last, the third filter F3 in FIG. 5 has a filter made up of the beam 44e forming the joint section of the first filter F1 and the beams 44c and 44d forming two support sections. In the structure of the third filter, the beams 44c, 44d, and 44e are excited by the third excitation electrode 56 and desired current iout3 to be output is detected directly from the fixed electrode 60. To drive the third filter F3, DC bias voltage Vp3 needs to be applied directly to the fixed electrode 60 and thus L and C (for cutting DC) are installed in the fixed electrode 60 for outputting iout3. The fixed electrode 60 acts as a third detection electrode.

According to the configuration, in the filter unit including the first to third filters, the joint sections or each portion are used mutually among the filters and the parts used as the joint section and the support section in one filter are used as the oscillators in another filter, so that miniaturization and weight reduction of the whole filter unit are made possible and it is made possible to provide a high-function and minute filter unit.

Third Embodiment

Figure 6:
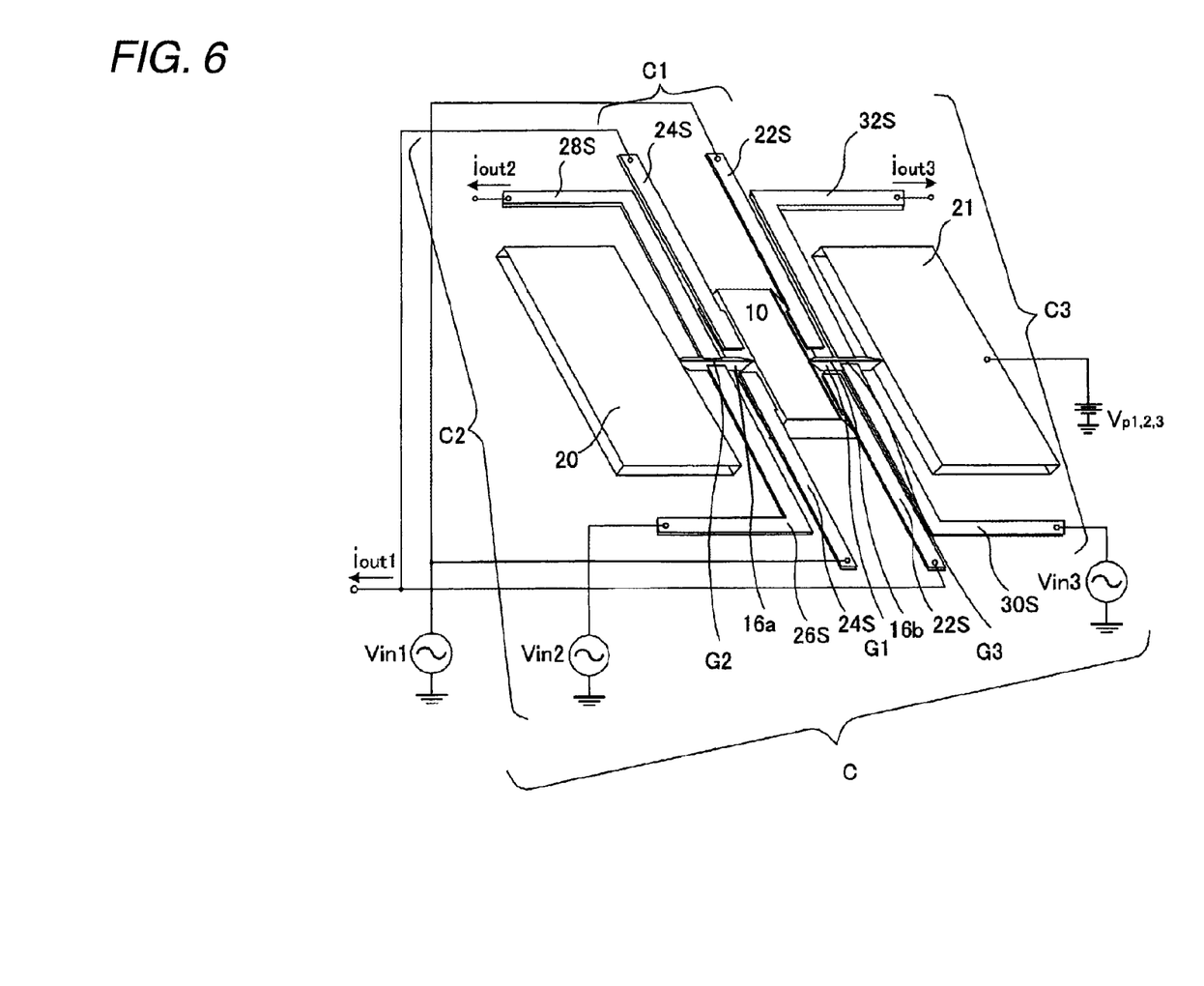
FIG. 6 is a perspective view of an electromechanical resonator of a third embodiment of the invention.

Next, a perspective view of an electromechanical resonator for torsionally oscillating is shown as a third embodiment of the invention. The resonator has an oscillator of a trapezoidal section beam 10 and support sections of two triangular section beams 16a and 16b for torsionally oscillating in a similar manner.

That is, like the electromechanical resonator of the first embodiment described above, the electromechanical resonator of the third embodiment of the invention is made up of three resonators of first to third resonators C1 to C3, which have inputs Vin1 to Vin3 and outputs Vout1 to Vout3, as shown in the perspective view of FIG. 6. In the configuration, support sections (16a and 16b) for supporting the center part from both sides so that an oscillator (10) of the first resonator C1 torsionally oscillates are oscillators of the second and third resonators C2 and C3, and miniaturization of the electromechanical resonator suited to dual mode and multiband systems capable of selecting a plurality of frequencies is realized. That is, the oscillator of the first resonator C1 is made up of a trapezoidal section beam 10, triangular section beams 16a and 16b as support sections, an excitation electrode 22S, a detection electrode 24S, and gap G1. The oscillator of the second resonator C2 is made up of the triangular section beam 16a, a fixed electrode 20 and the trapezoidal section beam 10 as support sections, an excitation electrode 26S, a detection electrode 28S, and gap G2. Last, the oscillator of the third resonator C3 is made up of the triangular section beam 16b, a fixed electrode 21 and the trapezoidal section beam 10 as support sections, an excitation electrode 30S, a detection electrode 32S, and gap G3.

The excitation electrodes are placed so that the first resonator C1 operates as secondary torsional oscillation of the trapezoidal section beam and the second and third resonators C2 and C3 operate as torsional oscillation with triangular section beams as oscillators. The oscillators are joined so that mutual nodes become joint sections. It is desirable that at least the joint section with the support section should come in the node of the first resonator. Drive is similar to that of the first embodiment.

In the electromechanical resonator, when the trapezoidal section beam adopts secondary torsional oscillation, the center of the oscillator has a node of the structure. Then, dissipation of oscillation can be decreased by supporting on the support sections 16a and 16b of triangular section beams from both sides of the center of the trapezoidal section beam. To use the support sections 16a and 16b of triangular section beams as oscillators, dissipation of oscillation to the trapezoidal section beam can also be decreased by resonating as similar torsional oscillation. Accordingly, it is made possible to efficiently select a plurality of frequencies from one electromechanical resonator.

Also in the embodiment, since each resonator operates at the natural frequency of the oscillator, usually if one input signal is input to the excitation electrodes of the three resonators at the same time, only the resonator where the frequency of the input signal and the natural frequency of the oscillator match operates, so that the resonator having the selection effect of three frequencies is configured in the third embodiment.

The third embodiment of the invention makes it possible to configure the resonator having the resonance frequencies of the first to third beams, namely, the resonator having a plurality of resonance frequencies and makes it possible to provide the small-size and high Q value resonator.

Figure 7:
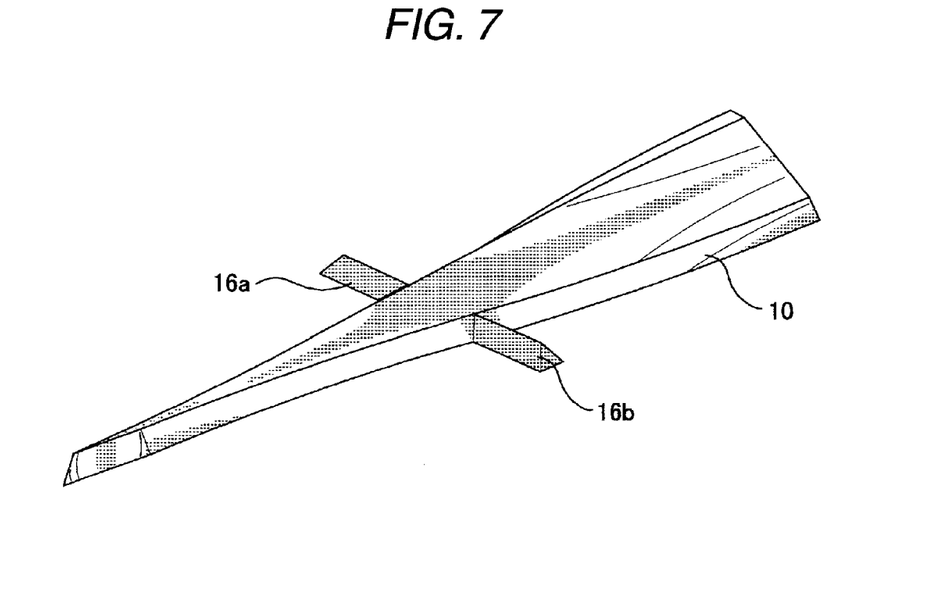
FIG. 7 is a drawing of finite element method simulation of the electromechanical resonator of the third embodiment of the invention.

FIG. 7 represents the result of simulating the structure according to the third embodiment of the invention using a finite element method. The dimensions of the beams of the simulation structure are as follows: The trapezoidal section beam has a length of 20 µm, a width of 2 µm, and a height of 0.5 µm, and the triangular section beam has a length of 2 µm, a width of 0.7 µm, and a height of 0.5 µm. In FIG. 6, the trapezoidal section beam is used as an oscillator and resonates at a resonance frequency of 47.6 MHz with secondary torsional oscillation. Dissipation of oscillation can be decreased by supporting on a fixed base using triangular section beam from the center of the beam as a node of oscillation, and an electromechanical resonator having a high Q value is realized.

Figure 8:
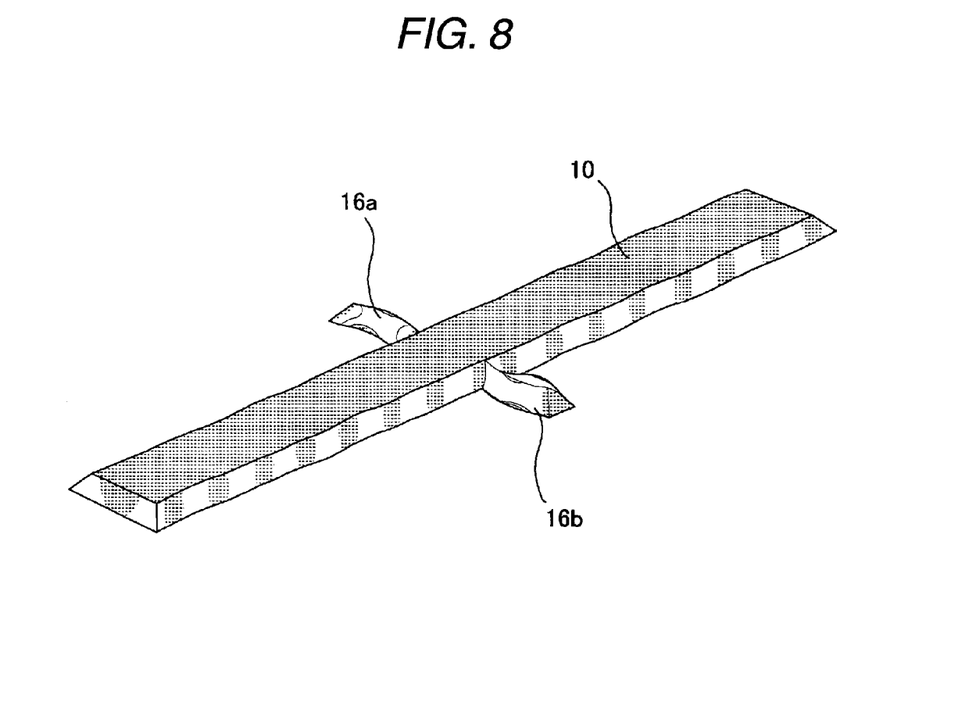
FIG. 8 is a drawing of finite element method simulation of the electromechanical resonator of the third embodiment of the invention.

FIG. 8 shows the simulation result of the case where the support sections of the triangular section beams 16a and 16b as oscillators in the structure according to the third embodiment of the invention. Here, the trapezoidal section beam 10 is assumed to be the support section for supporting one of the triangular section beams 16a and 16b and thus the triangular section beams 16a and 16b resonate as a twinlever. In FIG. 8, the two triangular section beams resonate as primary torsional oscillation and the resonance frequency is in the vicinity of 1 GHz.

Figure 9:
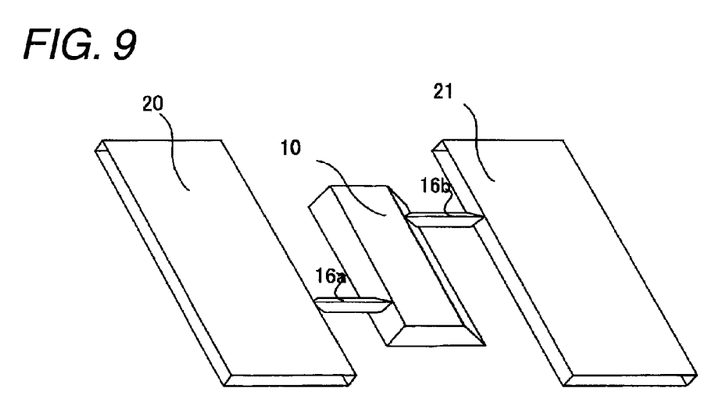
FIG. 9 is a drawing to show a modified example of the electromechanical resonator of the third embodiment of the invention.
Figure 10:
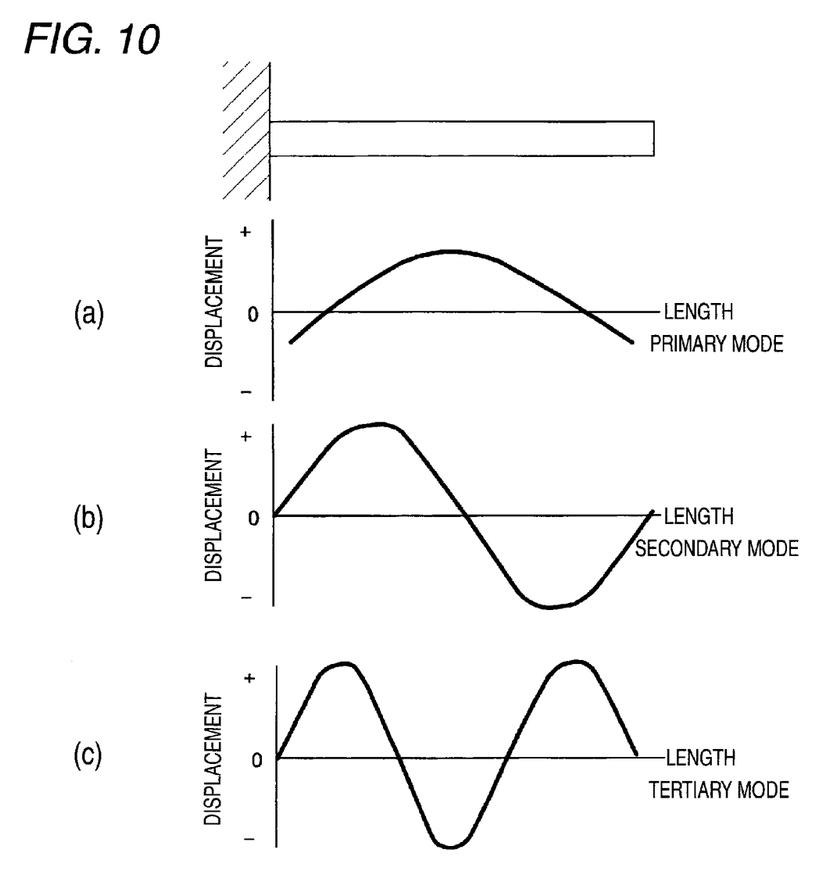
FIG. 10 is a drawing to show displacements of a flexural oscillation mode.

Next, a modified example of the electromechanical resonator of the third embodiment will be discussed. FIG. 9 represents a configuration wherein the trapezoidal section beam 10 of the first oscillator of the first resonator C1 is excited as other than torsional oscillation, corresponding to the modified example of the electromechanical resonator of the third embodiment of the invention. For example, to use flexural oscillation, the node of oscillation changes and thus it is desirable that the locations of the support sections of the triangular section beams 16a and 16b should be changed. FIG. 9 represents the placement locations of the support sections (triangular section beams 16a and 16b) if the trapezoidal section beam 10 resonates in a flexural oscillation primary mode. In a flexural oscillation secondary mode, the node exists in the center of the oscillator (trapezoidal section beam) and thus it holds in the support structure in FIG. 9. FIGS. 10 (a) to (c) are drawings to represent displacements of the basic mode (primary) and high-order modes (secondary and tertiary) in flexural oscillation of beam. FIG. 10 (a) shows the basic mode, FIG. 10 (b) shows the secondary mode, and FIG. 10 (c) shows the tertiary mode.

According to the third embodiment of the invention, the trapezoidal section beam 10 resonates in a VHF band (47.6 MHz) and the triangular section beams 16a and 16b resonate in a UHF band (1 GHz), so that an MEMS resonator capable of selecting two frequency bands from the structure of the resonator containing two support sections and one oscillator is realized.

In the embodiments, the electromechanical resonator and the electromechanical filter driven by an electrostatic force have been described, but the invention is not limited to them and can also be applied to other resonators such as resonators using piezoelectric drive, magnetic field drive, and photoelectric conversion, needless to say.

In the embodiments, the examples of using the triangular section beams and the trapezoidal section beam have been described, but the invention is not limited to them and can be changed appropriately.

INDUSTRIAL APPLICABILITY

According to the resonator and the filter of the invention, the configuration wherein the oscillators, the joint sections, and the support sections mutually play other roles and a plurality of frequency bands are included according to the same filter structure is realized and miniaturization and higher Q value of a mobile terminal are realized, so that the invention can be applied to various machines such as filters of dual mode and multiband radios.

The invention claimed is:

1. A resonator comprising:
   a first resonator including a first excitation electrode and a first oscillator for mechanically oscillating by the first excitation electrode; and
   a second resonator including a second excitation electrode and a second oscillator for mechanically oscillating by the second excitation electrode,
   wherein a support section for supporting the first oscillator forms the second oscillator, and
   wherein a node of oscillation of the first oscillator is positioned at a connection part of the first oscillator and the second oscillator.

2. The resonator according to claim 1, wherein the first oscillator has a resonance frequency lower than the second oscillator.

3. The resonator according to claim 1, wherein an insulating layer is provided at least in a part of a face of the first oscillator coming in contact with the first excitation electrode so that the first excitation electrode and the first oscillator abut via the insulating layer when a pull-in state is entered.

4. The resonator according to claim 1, wherein a node of oscillation of the second oscillator is positioned at a connection part of the second oscillator and the first oscillator.

5. The resonator according to claim 4, wherein the oscillation of the second oscillator is torsional oscillation.

6. The resonator according to claim 1 further comprising a third resonator including a third excitation electrode and a third oscillator for mechanically oscillating by the third excitation electrode,
   wherein at an end opposite the second oscillator, a support section for supporting the first oscillator forms the third oscillator.

7. The resonator according to claim 6 further comprising a detection electrode for detecting oscillation of at least one of the first to third oscillators.

8. The resonator according to claim 6, wherein the first to third resonators include first to third detection electrodes for detecting oscillation of the first to third oscillators respectively.

9. A resonator comprising:
   a first resonator including a first excitation electrode and a first oscillator for mechanically oscillating by the first excitation electrode; and
   a second resonator including a second excitation electrode and a second oscillator for mechanically oscillating by the second excitation electrode,
   wherein a support section for supporting the first oscillator forms the second oscillator, and
   wherein when one of the first and second oscillators oscillates, the other is placed in a pull-in state.

10. A filter comprising:
    a first excitation electrode and a pair of first oscillators joined so as to mechanically oscillate by the first excitation electrode; and
    a second excitation electrode and a pair of second oscillators joined so as to mechanically oscillate by the second excitation electrode,
    wherein a support section for supporting the pair of first oscillators forms the pair of second oscillators.

11. The filter according to claim 10, wherein a node of oscillation of one of the first oscillators is positioned at a connection part of said one of the first oscillators and one of the second oscillators.

12. The filter according to claim 11, wherein one of the first oscillators has a resonance frequency lower than one of the second oscillators.

13. The filter according to claim 10, wherein when one of the first and second pairs of oscillators oscillates, the other is placed in a pull-in state.

14. The filter according to claim 10, wherein an insulating layer is provided at least in a part of a face of one of the first oscillators coming in contact with the first excitation electrode so that the first excitation electrode and said one of the first oscillators abut via the insulating layer when a pull-in state is entered.

15. The filter according to claim 10, wherein a node of oscillation of one of the second oscillators is positioned at a connection part of said one of the second oscillators and one of the first oscillators.

16. The filter according to claim 15, wherein the oscillation of said one of the second oscillators is torsional oscillation.

17. The filter according to claim 10 further comprising a third excitation electrode and a pair of third oscillators for mechanically oscillating by the third excitation electrode,
    wherein at an end opposite one of the second oscillators, a support section for supporting the pair of first oscillators forms the pair of third oscillators.

18. The filter according to claim 17, further comprising a detection electrode being disposed with a predetermined spacing from at least one of the first to third pairs of oscillators for detecting oscillation of the at least one pair of oscillators.

19. The filter according to claim 18, wherein each of the first to third pairs of oscillators include first to third detection electrodes for detecting oscillation of the first to third pairs of oscillators respectively.

* * * * *